(12) United States Patent
Ohta

(10) Patent No.: US 7,439,475 B2
(45) Date of Patent: Oct. 21, 2008

(54) THERMALLY CONDUCTIVE BODY AND METHOD OF MANUFACTURING THE SAME

(75) Inventor: Mitsuru Ohta, Saitama (JP)

(73) Assignee: Polymatech Co., Ltd, Tokyo (JP)

( * ) Notice: Subject to any disclaimer, the term of this patent is extended or adjusted under 35 U.S.C. 154(b) by 0 days.

(21) Appl. No.: 11/810,707

(22) Filed: Jun. 7, 2007

(65) Prior Publication Data

US 2007/0284366 A1 Dec. 13, 2007

(30) Foreign Application Priority Data

Jun. 8, 2006 (JP) ............................. 2006-160019

(51) Int. Cl.
*H05B 3/10* (2006.01)
*H01L 23/48* (2006.01)

(52) U.S. Cl. ........................ 219/553; 219/552; 257/782; 257/783; 438/106; 438/118; 438/120

(58) Field of Classification Search ............. 219/552–3, 219/553; 257/782–3, 783; 438/106, 118, 438/120

See application file for complete search history.

(56) References Cited

FOREIGN PATENT DOCUMENTS

| JP | 4-173235 | | 6/1992 |
|----|----------|---|--------|
| JP | 11-46021 | * | 2/1999 |
| JP | 2001-294676 | * | 10/2001 |

* cited by examiner

*Primary Examiner*—Shawntina Fuqua
(74) *Attorney, Agent, or Firm*—Vidas, Arrett & Steinkraus PA

(57) ABSTRACT

The thermally conductive body for use by being placed between a heat generating body and a heat radiating body, in which the body is molded from a thermally conductive polymer composition. The thermally conductive polymer composition contains a polymer matrix and a thermally conductive filler. At least part of the thermally conductive filler is formed in the shape of fibers and oriented in a certain direction. In the body, ends of the thermally conductive filler formed in the shape of fibers are exposed on the outer surface intersecting the direction of the orientation. Protrusions extending along the outer surface are formed thereat. In case, the body is placed between the heat generating body and the heat radiating body so that the outer surface contacts at least one of the heat generating body and the heat radiating body.

17 Claims, 6 Drawing Sheets

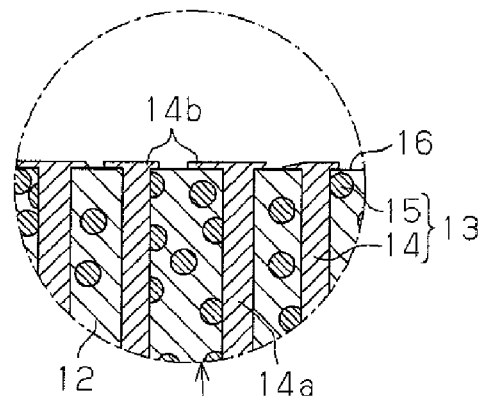
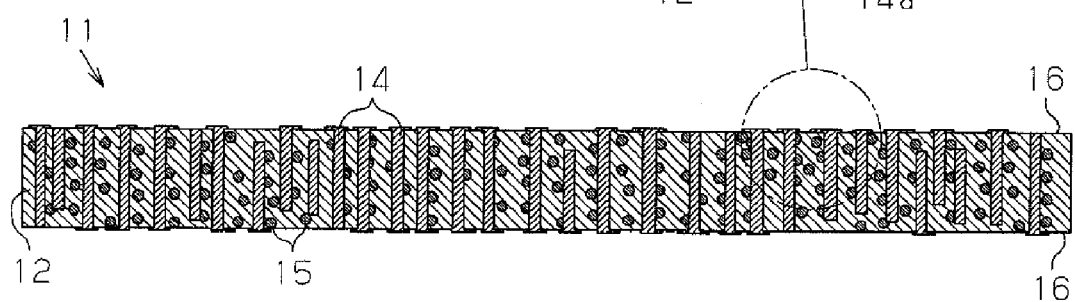
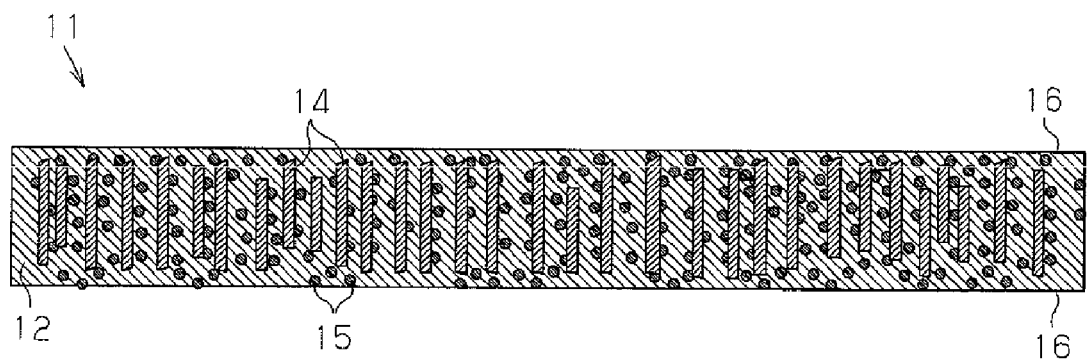

THERMALLY CONDUCTIVE BODY AND METHOD OF MANUFACTURING THE SAME

BACKGROUND OF THE INVENTION

The present invention relates to a thermally conductive body which is used by being placed between a heat generating body and a heat radiating body to accelerate thermal conduction from the heat generating body to the heat radiating body and a method of manufacturing the same.

In recent years, as the performance of electronic components typically exemplified by the CPU (central processing unit) of a computer have been enhanced, power consumption and heat caused by electronic components has been increasing. The throughput of electronic components is decreased by heat. Therefore, accumulation of heat in electronic components should be avoided so as to maintain the performance of the electronic components, and cooling of electronic components has become an important subject. Therefore excellent thermal conduction performance is demanded in a thermal conductive body that is used by being placed between an electronic component, which is a heat generating body, and a heat radiating body.

Japanese Laid-Open Patent Publication No. 4-173235 discloses a thermal conductive body composed of a composition containing thermally conductive fibers whose length is set to not more than 10 mm. Japanese Laid-Open Patent Publication No. 11-46021 discloses a thermally conductive body composed of a composition containing a thermally resistant polymer matrix and thermally conductive fibers. In these thermally conductive bodies, thermal conduction performance is enhanced by orienting thermally conductive fibers in the direction of the thermal conduction.

Japanese Laid-Open Patent Publication No. 2001-294676 discloses a thermally conductive sheet composed of a composition containing a binder and carbon fibers. The carbon fibers are oriented in the direction of the thickness of the thermally conductive sheet. Furthermore, ends of the carbon fibers are exposed on the outer surface of the thermally conductive sheet. Thermal conduction performance of this thermally conductive sheet is enhanced by the exposed carbon fibers which contact a heat generating body and a heat radiating body when sandwiched with the heat generating body and the heat radiating body.

However, the thermally conductive bodies disclosed in Japanese Laid-Open Patent Publication No. 4-173235 and Japanese Laid-Open Patent Publication No. 11-46021 have a problem in that handling properties thereof are poor, for example, when they are transported, because they are highly adhesive. The adhesiveness of the thermally conductive body increases as the hardness of the thermally conductive body decreases. Therefore, as a method to solve the above problem, for example, there has been mentioned a method to decrease the adhesiveness of the thermally conductive body by providing a layer having a higher hardness on the outer surface of the thermally conductive body. However, this method decreases the thermal conduction performance of the thermally conductive body since the addition of the above layer increases the hardness of the thermally conductive body. Besides, it is necessary to apply a large load from outside when sandwiching a thermally conductive body between a heat generating body and a heat radiating body so as to enhance the adhesion with the heat generating body and the heat radiating body. Therefore there was also a problem that a malfunction may be caused in the heat generating body due to this large load.

Meanwhile, gaps are formed between a thermally conductive sheet and a heat generating body and a heat radiating body due to the exposed carbon fibers in the thermally conductive sheet disclosed in Japanese Laid-Open Patent Publication No. 2001-294676. Therefore there is a problem that the contact thermal resistance value of the thermally conductive sheet increases and the thermal conduction performance of the thermally conductive sheet decreases.

SUMMARY OF THE INVENTION

An object of the present invention is to provide a thermally conductive body which is excellent in thermal conduction performance, and for which it is easy to increase the handling properties. The present invention also relates to a method of manufacturing the thermally conductive body.

To achieve the foregoing objective and in accordance with a first aspect of the present invention, a thermally conductive body which is used by being placed between a heat generating body and a heat radiating body is provided. The body is molded from a thermally conductive polymer composition. The thermally conductive polymer composition includes a polymer matrix and a thermally conductive filler. The thermally conductive body includes a thermally conductive filler and an outer surface. The thermally conductive filler is at least part of the thermally conductive filler, formed in the shape of fibers, and oriented in a certain direction. The outer surface intersects the direction of the orientation. The thermally conductive filler formed in the shape of fibers includes ends exposed on the outer surface and having protrusions extending along the outer surface. The thermally conductive body is placed between the heat generating body and the heat radiating body so that the outer surface contacts at least one of the heat generating body and the heat radiating body at the time of use.

In accordance with a second aspect of the present invention, a method for manufacturing a thermally conductive body which is used by being placed between a heat generating body and a heat radiating body. The body is molded from a thermally conductive polymer composition. The thermally conductive polymer composition includes a polymer matrix and a thermally conductive filler. The thermally conductive body includes a thermally conductive filler and an outer surface. At least part of the thermally conductive filler is formed in the shape of fibers, and oriented in a certain direction. The outer surface intersects the direction of the orientation. The thermally conductive filler as formed in the shape of fibers includes ends exposed on the outer surface and having protrusions extending along the outer surface. The thermally conductive body is placed between the heat generating body and the heat radiating body so that the outer surface contacts at least one of the heat generating body and the heat radiating body at the time of use. The method includes: a step of preparing the thermally conductive polymer composition; a step of orienting the thermally conductive filler formed in the shape of fibers in a certain direction; a step of molding the thermally conductive body while maintaining the orientation of the above thermally conductive filler; a step of exposing the end of the oriented thermally conductive filler on the outer surface; and a step of forming a protrusion in the end of the thermally conductive filler.

BRIEF DESCRIPTION OF THE DRAWINGS

FIG. 1A is a cross-sectional view illustrating a body of an embodiment of the present invention;

FIG. 1B is an enlarged cross-sectional view illustrating a body;

FIG. 2 is a cross-sectional view illustrating a body after a molding step;

DETAILED DESCRIPTION OF THE PREFERRED EMBODIMENTS

Figure 3B:
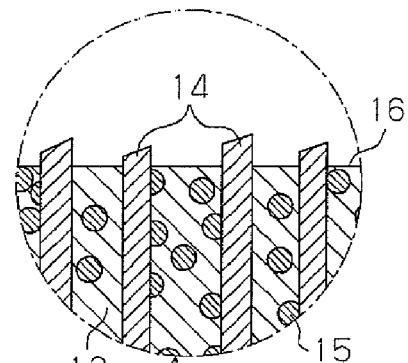
FIG. 3B is an enlarged cross-sectional view illustrating a body.

Hereinafter, an embodiment of the present invention in accordance with the invention is described in detail with reference to the drawings. The thermally conductive body of the embodiment of the present invention (hereinafter simply referred to as a body) is molded from a thermally conductive polymer composition comprising a polymer matrix and a thermally conductive composition (hereinafter simply referred to as composition). This body is used by being disposed between a heat generating body and a heat radiating body, and it accelerates thermal conduction from the heat generating body to the heat radiating body.

The body possesses thermal conduction performance and handling properties. The thermal conduction performance is an index which shows the ease of thermal conduction from a heat generating body to a heat radiating body, and the thermal conduction performance is caused by the thermal conductivity, thermal resistance value and contact thermal resistance value of the body. The thermal resistance value of the body becomes smaller as the coefficient of thermal conductivity of the body increases. The contact thermal resistance value of the body becomes smaller as adhesion of the body with the heat generating body and the heat radiating body becomes greater. The adhesion of the body with the heat generating body and the heat radiating body becomes higher as the adhesiveness of the body increases. The body accelerates thermal conduction from the heat generating body to the heat radiating body and exhibits greater thermal conduction performance as the coefficient of thermal conductivity becomes higher and the thermal resistance value and contact thermal resistance value decrease. The handling property is an index to express the ease of handling of the body and is caused by the adhesiveness of the body. That is, the handling property of the body increases as the adhesiveness of the body decreases.

The polymer matrix maintains the thermally conductive filler in the body. The polymer matrix is selected in accordance with the properties required for the body, for example, mechanical strength such as hardness, durability such as thermal resistance, or electrical properties. For example, a thermoplastic or thermosetting polymer material is selected as a polymer matrix. Specific examples of thermoplastic polymer materials include thermoplastic resin materials and thermoplastic elastomers.

Specific examples of the thermoplastic resin material include polyethylene, polypropylene, ethylene-α olefin copolymers such as ethylene-propylene copolymer, polymethylpentene, polyvinyl chloride, polyvinylidene chloride, polyvinyl acetate, ethylene-vinyl acetate copolymer, polyvinyl alcohol, polyvinyl acetal, fluorine-based polymers such as polyvinylidene fluoride and polytetrafluoroethylene, polyethylene terephthalate, polybutylene terephthalate, polyethylene naphthalate, polystyrene, polyacrylonitrile, styrene-acrylonitrile copolymer, acrylonitrile-butadiene-styrene copolymer (ABS) resin, polyphenylene-ether copolymer (PPE) resin, modified PPE resin, aliphatic polyamides, aromatic polyamides, polyimide, polyamide-imide, polymethacrylic acid, polymethacrylic acid esters such as polymethyl methacrylate ester, polyacrylic acid, polycarbonate, polyphenylene sulfide, polysulfone, polyethersulfone, polyether nitrile, poly etherketone, poly ketone, liquid crystal polymer, silicone resin, and ionomer.

Specific examples of the thermoplastic elastomers include styrene-butadiene block copolymers and hydrogenated polymers thereof, styrene-isoprene block copolymers and hydrogenated polymers thereof, styrene thermoplastic elastomers, olefinic thermoplastic elastomers, vinyl chloride thermoplastic elastomers, polyester thermoplastic elastomers, polyurethane thermoplastic elastomers, and polyamide thermoplastic elastomers.

Specific examples of the thermosetting polymer materials include cross-linked rubber, epoxy resin, phenol resin, polyimide resin, unsaturated polyester resin, and diallyl phthalate resin. Specific examples of the cross-linked rubber include natural rubber, acrylic rubber, butadiene rubber, isoprene rubber, styrene-butadiene copolymer rubber, nitrile rubber, hydrogenated nitrile rubber, chloroprene rubber, ethylene-propylene copolymer rubber, chlorinated polyethylene rubber, chlorosulfonated polyethylene rubber, butyl rubber, halogenated butyl rubber, fluorine-containing rubber, polyurethane rubber, and silicone rubber.

Among these, silicone polymer materials are preferable since they provide high thermal resistance for the body, adhesion to the heat generating body and the heat radiating body, properties for following the surface shape of the heat generating body and the heat radiating body and durability against changes in temperature, and acrylic polymer materials are preferable since they prevent emission of low molecular weight volatile components from the body. The polymer matrix may be a polymer alloy composed of plural polymer materials selected from the above-mentioned polymer materials. The viscosity at normal temperature of the polymer matrix is preferably 1000 mPa·s or less and more preferably 500 mPa·s or less. When the viscosity of the polymer matrix exceeds 1000 mPa·s, the preparation of the composition may be difficult since the viscosity of the polymer matrix is excessively high. The lower limit of the viscosity at normal temperature of the polymer matrix is not limited in particular. Normal temperature is a temperature when the compositions are usually prepared, and for example it is 25° C.

The thermally conductive filler enhances thermal conduction performance of the body by increasing the thermal conductivity of the body. The shape of the thermally conductive filler may be fibrous, particulate, tabular and so on, but at least part of the thermally conductive filler is formed into fibers. Specific examples of the thermally conductive filler formed into fibers, that is, specific examples of the fibrous filler, include carbon fibers, metal fibers, glass fibers, ceramic fibers, and organic polymer fibers. These may constitute the fibrous filler alone or two or more of them may constitute the fibrous filler in combination. Among these, carbon fibers are preferable since carbon fibers provide high thermal conductivity of the body.

The carbon fibers can be manufactured by subjecting melt spun fibrous pitch to non-melting treatment followed by carbonizing or graphitizing treatment. The fiber length of the carbon fibers can be arbitrarily adjusted by crushing carbon fibers during or after the production thereof. Crushing of the carbon fibers can be performed by, for example, using a beater mill, a ball mill, a vibratory ball mill, a blade mill, a jet mill, a tornado mill, or a mill mixer. Carbon fibers whose length has a narrow distribution width and which are suitable for a body can be obtained by further crushing chopped fibers, which are obtained by crushing carbon fibers during or after the production thereof with a cutting machine, with the above-mentioned apparatus. Carbon fibers which are just chopped fibers may be used.

The fibrous filler is oriented in a body in a certain direction, and the heat from the heat generating body is conducted through the body along the direction of orientation of the fibrous filler. Therefore it is preferable that the average fiber length of the fibrous filler be more than the thickness of the body in the direction of the orientation of the fibrous filler. In this case, the thermal conductivity of the body can be readily increased since the fibrous filler is present without a break along the direction of the thermal conduction. When the average fiber length of the fibrous filler is less than the thickness of the body in the direction of the orientation of the fibrous filler, it is preferable, for example, that the oriented fibrous filler overlaps each other so that thermally conductive fibers are present without a break along the direction of the thermal conduction of the body.

The thermally conductive filler material with a shape other than a fiber, that is, material of a non-fibrous filler is preferably selected from at least one of aluminum oxide, boron nitride, aluminum nitride, silicon carbide, and silicon dioxide since they provide high thermal conductivity of the body. Among non-fibrous fillers, the average particle size of the particulate filler can be suitably set in accordance with the proportion of the fibrous filler in the thermally conductive filler and the average fiber length of the fibrous filler, but it is preferably 0.1 to 100 μm and more preferably 1 to 50 μm. When the average particle size of the particulate filler is less than 0.1 μm, the specific surface area of the thermally conductive filler contained in the composition is excessively large and the viscosity of the composition may be too high. In the case where the average particle size of the particulate filler exceeds 100 μm, if the body is formed into a thin sheet, unevenness caused by the particulate filler is formed on the outer surface of the body, and flatness of the outer surface of the body may be deteriorated. As for the shape of the particulate filler, a spherical shape is preferable since the second aggregation of the thermally conductive filler in the composition is suppressed.

The content of the thermally conductive filler in the composition is preferably 90 mass % or less. When the content of the thermally conductive filler exceeds 90 mass %, the body becomes fragile and the properties to follow the surface shape of the heat generating body and the heat radiating body of the body may be deteriorated due to low flexibility of the body when, for example, the body is in the form of a sheet. The thermally conductive filler may consist only of a fibrous filler but the proportion of the fibrous filler in the total amount of the thermally conductive filler is preferably 7 mass % or more and less than 35 mass %.

When the proportion of the fibrous filler is less than 7 mass %, the content of the fibrous filler in the body is too low and the thermal conductivity of the body may be decreased. When the proportion of the fibrous filler is 35 mass % or more, the conductivity of the body increases in the case that the fibrous filler is electrically conductive, for example, in the case that the fibrous filler is carbon fibers, and there is a possibility that the body cannot be used when the body preferably shows no conductivity. Therefore, when the body should have conductivity, the thermally conductive filler may consist only of a fibrous filler, for example, carbon fibers. The composition may contain, for example, a plasticizer to adjust the hardness of the body and a stabilizer to enhance the durability in addition to each of the above-mentioned constituents.

A body 11 possesses a polymer matrix 12 and a thermally conductive filler 13 as shown in FIG. 1A and FIG. 1B. The body 11 shown in FIG. 1A and FIG. 1B is formed into a sheet and the thermally conductive filler 13 has a fibrous filler 14, and a particulate filler 15. The shape of this body 11 is not limited in particular, and may be cubic, spherical, columnar, tabular, form of film or tubular. The fibrous filler 14 is oriented in the body 11 in a certain direction. For example, in the body 11 shown in FIG. 1A and FIG. 1B, the fibrous filler 14 is oriented in the direction of the thickness of the body 11. Therefore, the value of the thermal conductivity in the thickness direction in the body 11 is equal to the value obtained by multiplying the value of the thermal conductivity in the width direction by two to several hundreds.

In the body 11, the fibrous filler 14 is exposed on the outer surface intersecting the direction of the orientation of the fibrous filler 14. That is, the fibrous filler 14 in the body 11 shown in FIG. 1A and FIG. 1B extends in the width direction of the body 11 and is exposed on a pair of oppositely facing outer surfaces 16. In the fibrous filler 14 exposed on the outer surfaces 16 of the body 11, the proportion of the fibrous filler 14 exposed on the outer surfaces 16 in an intersecting condition is preferably 50 to 100%. When the proportion of the fibrous filler 14 exposed on and intersecting the outer surfaces 16 is less than 50%, that is, when the proportion of the exposed fibrous filler 14 extending in parallel with the outer surfaces 16 exceeds 50%, the orientation direction of the fibrous filler 14 is insufficient and there is a possibility that the thermal conductivity of the body 11 in the direction of the orientation of the fibrous filler 14 may be decreased. Therefore, when the proportion of the fibrous filler 14 exposed on and intersecting the outer surfaces 16 exceeds 50%, the thermal conductivity of the body 11 in the orientation direction of the fibrous filler 14 can be 20 W/m·k or more and as the proportion of the fibrous filler 14 exposed on and intersecting the outer surfaces 16 increases, for example, 50 W/m·k or more can be achieved.

The fibrous filler 14 exposed on and intersecting the outer surfaces 16 of the body 11 has rod-like portions 14a extending in the orientation direction and ends exposed from the outer surfaces. Protrusions 14b extending along outer surfaces 16 are formed in the ends of the fibrous filler 14. Owing to the protrusions 14b, the cross section perpendicular to the fiber axial direction (direction of orientation) of the fibrous filler 14 in the end having the protrusions 14b is larger than the cross section perpendicular to the fiber axial direction in the axis part 14a of the fibrous filler 14 and, for example, the former is twice or more larger than the latter cross section.

The exposed length, that is, the distance between the outer surface 16 of the body 11 and the tip of the fibrous filler 14 which is exposed on and intersecting the outer surface 16 of the body 11 is preferably not more than 50 μm. When the exposed length of the fibrous filler 14 exceeds 50 μm, there is a possibility that the fibrous filler 14 may fall off the body 11.

The body 11 is manufactured by performing a preparation step for preparing a composition, an orienting step for orienting the fibrous filler 14 in a certain direction, a molding step for molding the body 11, an exposing step for exposing the fibrous filler 14 and forming step for forming the protrusions 14b.

In the preparation step, the above-mentioned constituents are mixed appropriately and a composition is prepared. In the orienting step, the fibrous filler 14 are oriented in a certain direction after, for example, a die was filled with the composition. As for the methods to orient the fibrous filler 14, a method of applying a magnetic field to the composition using a magnetic field generator and a method of applying vibration to the composition using a vibrating device can be included. Among these methods, a method of applying both magnetic field and vibration to the composition is preferable since the method allows the fibrous filler 14 to be readily oriented. The magnetic field and the vibration are applied to the fibrous filler 14 through the composition at this time.

A permanent magnet, an electromagnet and a superconducting magnet can be included for a magnetic field generator but a superconducting magnet is preferable because it allows the fibrous filler 14 having long fiber length to be readily oriented. The direction of the magnetic field applied to the composition can be suitably set in accordance with the fibrous filler 14 in the composition. For example, a pair of magnetic poles of the magnetic field generator are disposed so that they may face each other with the die therebetween. When the fibrous filler 14 is a diamagnetic material, the fibrous filler 14 is magnetized by a magnetic field applied to the composition in a direction opposite to the direction of the magnetic field, and the fibrous filler 14 is oriented along a line of magnetic force. When magnetic susceptibility of the fibrous filler 14 has anisotropy caused by the crystal orientation of the crystal structure of the fibrous filler 14, the fibrous filler 14 is oriented following the anisotropy of the susceptibility.

As for a vibrating device, a supersonic wave vibrating device, an electromagnetic-type vibrating device, a motor vibrating device and a key stroke-type vibrating device using an air cylinder can be included. Among them, the key stroke-type vibrating device using an air cylinder is preferable since it allows the fibrous filler 14 having long fiber length to be readily oriented. When the content of the thermally conductive filler 13 in the composition is high, the viscosity of the composition is generally high. Therefore it is preferable that the frequency of vibration applied to the composition be lower than the natural frequency of the composition and it is more preferably 0.1 to 100 Hz, and most preferably 1 to 100 Hz. In this case, since the vibration readily reaches the whole of the composition, the fluidity of the composition is enhanced, and, as a result, apparent viscosity of the composition decreases. Therefore the fibrous filler 14 entangled in the composition can readily come loose, and tend to be readily oriented.

When the frequency of vibration applied to the composition is too low, it takes time to sufficiently apply vibration to the composition, and there is a possibility that production efficiency of the body 11 may deteriorate. Furthermore, there is a possibility that the fibrous filler 14 will not be sufficiently oriented. When the frequency of vibration applied to the composition is excessively high, only slight vibration can be applied to the composition, and it becomes difficult to allow the vibration to expand through the whole of the composition. Furthermore, the frequency of the vibration applied to the composition is far off from the natural frequency of the composition and the apparent viscosity of the composition does not decrease. Therefore there is a possibility that orientation of the fibrous filler 14 will be insufficient because the fibrous filler 14 is oriented while the viscosity of the composition is in a high state. Therefore, the frequency of vibration applied to the composition is preferably set to 0.1 to 100 Hz, more preferably 1 to 100 Hz, thereby the production efficiency of the body 11 can be enhanced and the fibrous filler 14 can be sufficiently oriented.

The amplitude of vibration applied to the composition is preferably 0.1 to 20 mm, and more preferably 1 to 20 mm. When the amplitude of vibration is less than 0.1 mm, there is a difficultly in that the vibration is transmitted over whole of the composition and there is a possibility that orientation of the fibrous filler 14 may be insufficient. When the amplitude of vibration exceeds 20 mm, time is required to apply the vibration to the composition sufficiently, and there is a possibility that production efficiency of the body 11 may be deteriorated.

In the molding step, the body 11 having a predetermined shape is molded as shown in FIG. 2 by curing or solidifying the polymer matrix 12 while maintaining the orientation of the fibrous filler 14 within a die. The fibrous filler 14 of the body 11 immediately after the molding step is not exposed on its outer surface 16.

Figure 3A:
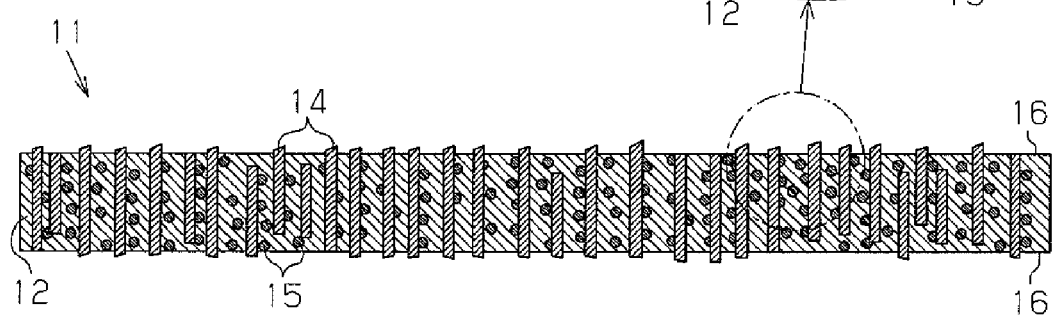
FIG. 3A is a cross-sectional view illustrating a body after an exposing step.

When the body 11 has a thermoplastic polymer material as the polymer matrix 12, the fibrous filler 14 can be exposed on outer surface 16 as shown in FIG. 3A and FIG. 3B by removing the polymer matrix 12 from the outer surface 16 of the body 11 using a solvent which can dissolve the polymer material in the exposing step. Alternatively, the polymer matrix 12 can be removed from the outer surface 16 by pushing a mesh-molded blade against the outer surface 16 of the body 11 and sliding the blade along the outer surface 16, and the fibrous filler 14 can be exposed on the outer surface 16. In this case, the polymer matrix 12 can be removed at a uniform thickness. In addition, the polymer matrix 12 can be removed from the outer surface 16 by polishing with abrasive paper, and the fibrous filler 14 can be exposed on the outer surface 16. Immediately after the exposing step, the protrusions 14b are not formed in the ends of the fibrous filler 14 exposed on the outer surface 16.

The proportion of the exposed fibrous filler 14 on the outer surface 16 of the body 11 after the exposing step is, for example, 5 to 10% when converted to an area projected from the projection of the outer surface 16. When the proportion of the exposed the fibrous filler 14 is less than 5%, orientation of the fibrous filler 14 is insufficient and there is a possibility that thermal conductivity of the body 11 in the direction of the orientation of the fibrous filler 14 may be decreased. When the proportion of the exposed fibrous filler 14 exceed 10%, there is a possibility that flexibility of the body 11 may be deteriorated although thermal conductivity of the body 11 can be increased.

In the forming step, the outer surface 16 of the body 11 is polished with smoother abrasive paper as compared with abrasive paper used in the exposing step, for example, abrasive paper using abrasive particles whose particle size is 5 to 20 μm. At this time, the distal ends of the fibrous filler 14 exposed on the outer surface 16 are collapsed or wore down and spread along the outer surface 16. This forms the protrusions 14b in the ends of the fibrous filler 14. In addition, pressure is applied momentarily on the outer surface 16 of the body 11 and the tips of the fibrous filler 14 are pressed toward the outer surface 16. At this time, the tips of the fibrous filler 14 exposed on the outer surface 16 are collapsed or bent down over the outer surface 16, and the protrusions 14b is formed in the ends of the fibrous filler 14. The proportion of the exposed fibrous filler 14 on the outer surface 16 of the body 11 after the forming step is increased by the protrusions 14b as compared with the proportion of the fibrous filler 14 after the exposing step and before the forming step and it is, for example, 10% or more when converted to the above-mentioned area.

Figure 4B:
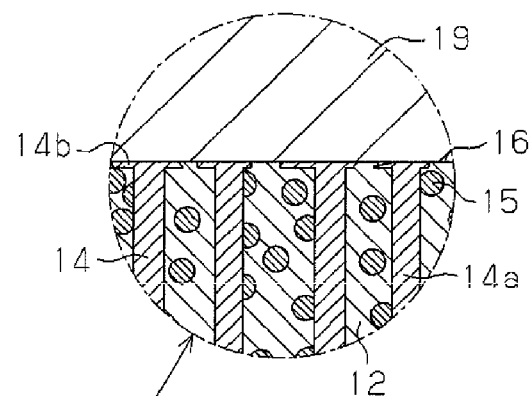
FIG. 4B is an enlarged cross-sectional view illustrating a body.
Figure 4A:
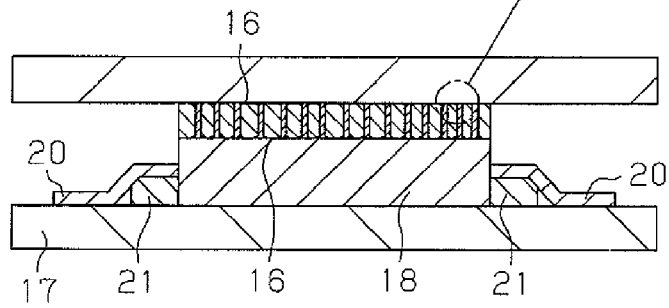
FIG. 4A is a cross-sectional view illustrating a body sandwiched by a heat generating body and a heat radiating body.

When the body 11 is attached to a heat generating body and a heat radiating body, the body 11 and a heat radiating body 19 are placed in this order, for example, on a heat generating body 18 (for example, electronic component) disposed on a substrate 17 as shown in FIG. 4A. The lower part of the heat generating body 18 is covered with an insulating layer 20, and terminals 21 to connect the heat generating body 18 to the electric circuit not illustrated on the substrate 17 are disposed between the substrate 17 and the insulating layer 20. The body 11 is placed so that a pair of the outer surfaces 16 come in contact with the heat generating body 18 and the heat radiating body 19. Subsequently load is applied from the heat radiating body 19 to the heat generating body 18 so that the body 11 adheres to the heat generating body 18 and the heat radiating body 19, and the body 11 is sandwiched with the heat generating body 18 and the heat radiating body 19.

At this time, the protrusions 14b of the fibrous filler 14 exposed on the outer surface 16 of the body 11 are pressed against and immersed into the body 11 as shown in FIG. 4B by the above-mentioned load. Furthermore, the polymer matrix 12 spreads among the exposed fibrous filler 14 by the above-mentioned load. Therefore the fibrous filler 14 is relatively immersed in the polymer matrix 12 in the body 11. The surfaces of the protrusions 14b facing the heat generating body 18 or the heat radiating body 19 are located on the outer surface 16 of the body 11. As a result, the adhesiveness of the body 11 increases due to the spread polymer matrix 12, and the body 11 adheres to the heat generating body 18 and the heat radiating body 19 without forming gaps between the heat generating body 18 and the heat radiating body 19. The value of a load added to the heat radiating body 19 is, for example, 4.9 N.

The advantages exhibited by the above-mentioned embodiment are described below.

The fibrous filler 14 of an embodiment of the present invention is exposed from the outer surface 16 of the body 11 before the above-mentioned body 11 is used. The protrusions 14b extending along the outer surface 16 are formed in the ends of the fibrous filler 14 exposed from the outer surface 16. In the outer surface 16 of the body 11, the proportion of the exposed fibrous filler 14 is increased by the protrusions 14b as compared with the case where the above-mentioned protrusions 14b are not formed.

Therefore, when the body 11 comes in contact with an object to be contacted, the contact of the polymer matrix 12 which constitutes the body 11 with an object to be contacted is suppressed by the exposed fibrous filler 14 on the outer surface 16 of the body 11, and it is suppressed more surely by the protrusions 14b. Here, the hardness of the polymer matrix 12 is usually lower in comparison with the fibrous filler 14. Therefore, the contact between the polymer matrix 12 having a lower hardness and an object to be contacted is suppressed in the body 11, the handling properties thereof can be readily enhanced by decreasing the adhesiveness thereof. When the handling properties of the body are enhanced by providing a layer having a higher hardness on the outer surface of the body, the flexibility of the body is deteriorated since the hardness of the body increases due to the above layer. In contrast, the body 11 of this embodiment of the present invention can maintain flexibility since the handling properties are enhanced without decreasing the hardness.

Furthermore, the body 11 is sandwiched between the heat generating body 18 and the heat radiating body 19 so that the outer surfaces 16 may contact with the heat generating body 18 and the heat radiating body 19 at the time of the use and the fibrous filler 14 is relatively immersed in the polymer matrix 12 in the body 11. Therefore, the polymer matrix 12 having a lower hardness can readily contact with the heat generating body 18 and the heat radiating body 19 in the outer surface 16 of the body 11. Therefore, adhesion of the body 11 can be enhanced, and, as a result, the body 11 can adhere to the heat generating body 18 and the heat radiating body 19.

In addition, the fibrous filler 14 immersed in the body 11 can contact with the heat generating body 18 and the heat radiating body 19 as shown in FIG. 4B without the polymer matrix 12 in between, and, as a result, the fibrous filler 14 can readily conduct heat from the heat generating body 18 to the heat radiating body 19. Therefore the body 11 can show excellent thermal conduction performance. Furthermore, since the protrusions 14b extend along the outer surface 16, the contact area of the fibrous filler 14 with the heat generating body 18 and the heat radiating body 19 increases as compared with the contact area of the case where the protrusions 14b are not formed when the body 11 is sandwiched with the heat generating body 18 and the heat radiating body 19. Therefore, the body 11 can have enhanced thermal conduction performance as compared with the case where the protrusions 14b are not formed.

The cross section perpendicular to the fiber axial direction of the fibrous filler 14 in the end having the protrusion 14b of the fibrous filler 14 is larger than the cross section perpendicular to the fiber axial direction in the rod-like portions 14a of the fibrous filler 14 due to the protrusions 14b. Therefore, the fibrous filler 14 having the protrusions 14b enables the proportions of the fibrous filler 14 in the outer surface 16 of the body 11 to be readily increased as compared to the case where the protrusions 14b are not formed without increasing the content of thermally conductive filler 13 in the body 11. As a result, improvement of thermal conduction performance of the body 11 and the suppression of deterioration in the flexibility of the body 11 caused by increase of the content of the thermally conductive filler 13 can be achieved at the same time.

The embodiment of the present invention may be modified as follows.

For example, surface treatments such as those using silane coupling agents or titanate coupling agents may be performed on the thermally conductive filler 13 to enhance the adhesion of the above polymer matrix 12 with the thermally conductive filler 13. In addition, the surface treatment using an insulator may be performed on the thermally conductive filler 13 to provide the thermally conductive filler 13 with insulating properties.

The above fibrous filler 14 may be exposed on only one of the outer surfaces 16. In this case, the adhesiveness of only one of the outer surfaces 16 of the body 11 can be decreased.

The polymer matrix 12 may fill the space among the fibrous filler 14 after the fibrous filler 14 is arranged in a certain direction in the above orienting step.

The body 11 may be molded by orienting the fibrous filler 14 on the substrate film after the composition is applied to the substrate film in the above orienting step and the molding step. In this case, the polymer matrix 12 may be removed by, for example, by scraping off the outer surface 16 which does not come in contact with the substrate film of the body 11 using a rotary disc cutter in the exposing step.

Figure 5A:
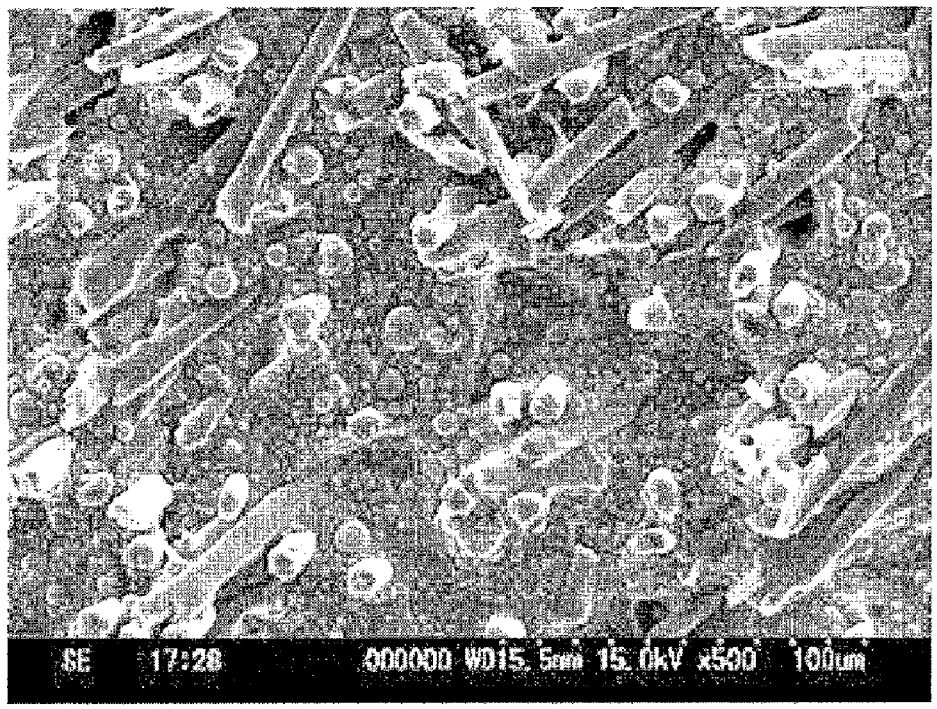
FIG. 5A is an electron micrograph showing the outer surface of the body from above after the exposing step of Example 1.
Figure 5B:
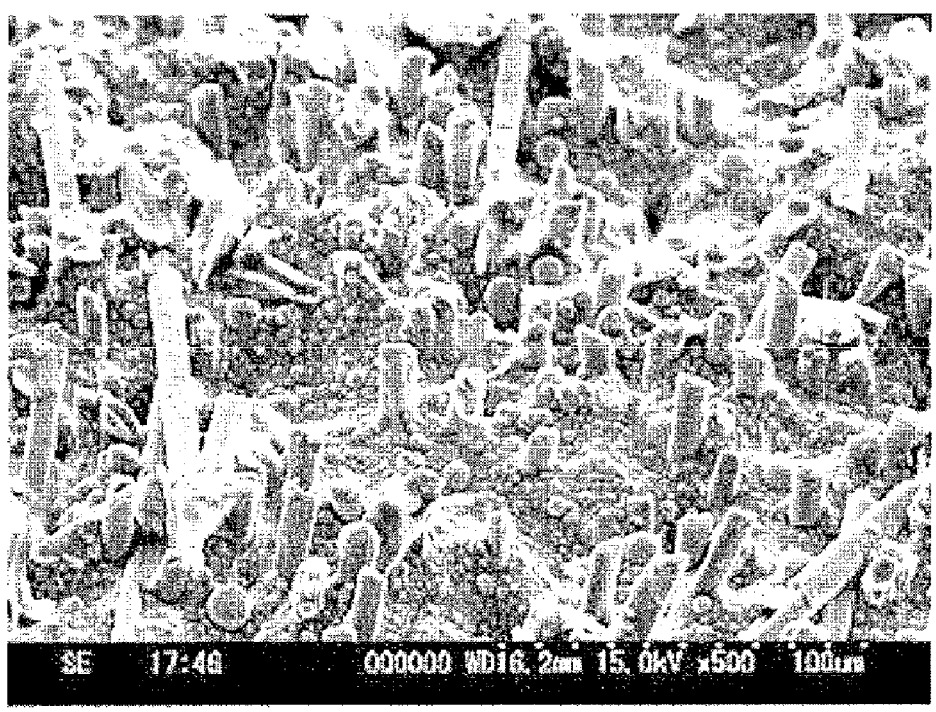
FIG. 5B is an electron micrograph showing the outer surface of the body from obliquely above after the exposing step of Example 1.

When the above the body 11 is formed in the shape of a sheet, the body 11 may be cut into sheets using a shear blade after the body 11 in the shape of a block is formed in the above molding step. At this time, since the hardness of the polymer matrix 12 is lower than the hardness of the fibrous filler 14, the polymer matrix 12 is cut off more than the fibrous filler 14, and as a result, the fibrous filler 14 is exposed on the cross section (the outer surface 16) of the body 11 as shown in FIG. 5A and FIG. 5B. Therefore, exposing step is performed at the same time in this molding step. In the body 11 shown in FIG. 5A and FIG. 5B, the proportion of the fibrous filler 14 exposed on and intersecting the cross section is about 90%. Furthermore, the distal end surfaces of the exposed fibrous filler 14 are slanted against fiber axis of the fibrous filler 14.

Defoaming of the composition may be performed in the above preparation step or orienting step.

Exposing step and forming step may be performed at the same time using smooth abrasive paper.

The above embodiment is described more specifically by way of Examples and Comparative Examples below.

EXAMPLES 1 TO 5 AND COMPARATIVE EXAMPLES 1 AND 2

In Example 1, carbon fiber as the fibrous filler 14 and particulate aluminum oxide (hereinafter referred to as alumina) as the particulate filler 15 were mixed with an addition type liquid silicone gel as the polymer matrix 12 as a preparation step, and a composition for the body 11 was prepared. The mixed amounts of each constituent are shown in Table 1. In Table 1, the numerical value of the mixed amounts of each constituent is shown by part by weight. The viscosity of the liquid silicone gel at 25° C. was 400 mPa·s, and the specific gravity of the liquid silicone gel was 1.0. The average fiber diameter of the carbon fiber was 10 μm, and the average fiber length of the carbon fiber was 160 μm. The average particle size of the alumina was 3.2 μm. Next, defoaming of the composition was performed after the composition was stirred till the carbon fiber and spherical alumina were dispersed uniformly.

Successively, a die was filled with the composition as orienting step after the viscosity of the composition at 25° C. was measured using a rotation viscometer. The results of the measurement of the viscosity are shown in Table 1. Next, while a magnetic field having a magnetic flux density of 100,000 gauss was applied to the composition with a super-conducting magnet, vibration having a frequency of 3.0 Hz and an amplitude of 10 mm was applied to the composition through a die using an air cylinder to orient the carbon fibers in the direction of thickness of the body 11.

Subsequently, as a molding step, the liquid silicone gel was hardened by heating the composition at 120° C. for 90 minutes and a body 11 in the form of a block was obtained. And, as an exposing step, the block-shaped body 11 was cut into sheets having a thickness of 0.2 mm using a shear blade and the carbon fibers are exposed. When the outer surface 16 of the body 11 after the exposing step was observed with an electron microscope, exposure of the carbon fibers was found as shown in FIG. 5A and FIG. 5B and the proportion of the carbon fibers exposed on and intersecting the outer surface 16 in the exposed carbon fibers was about 90%.

Figure 6A:
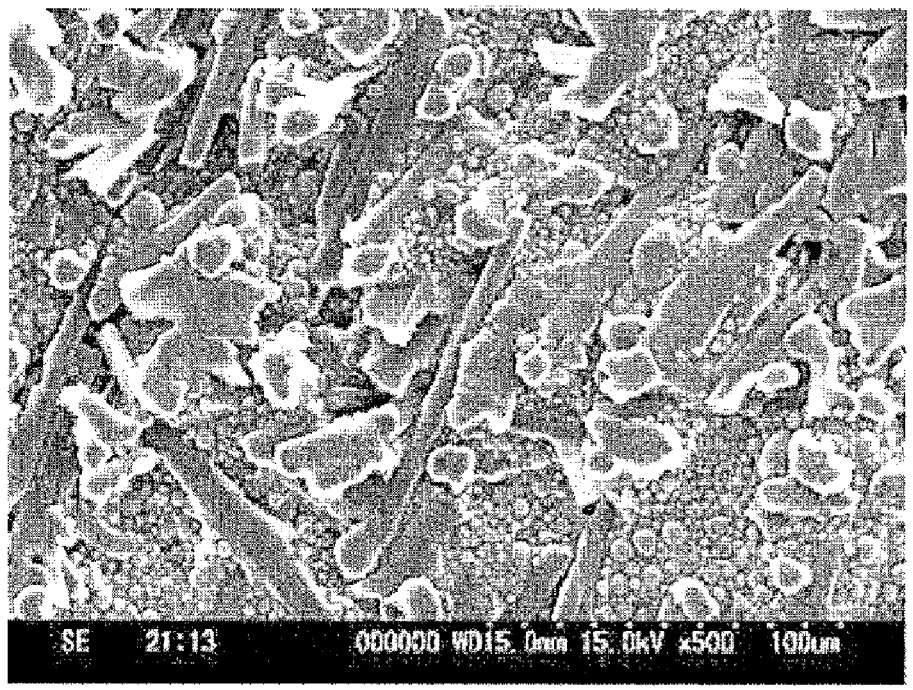
FIG. 6A is an electron micrograph showing the outer surface of the body from above after the forming step of Example 1.
Figure 7:
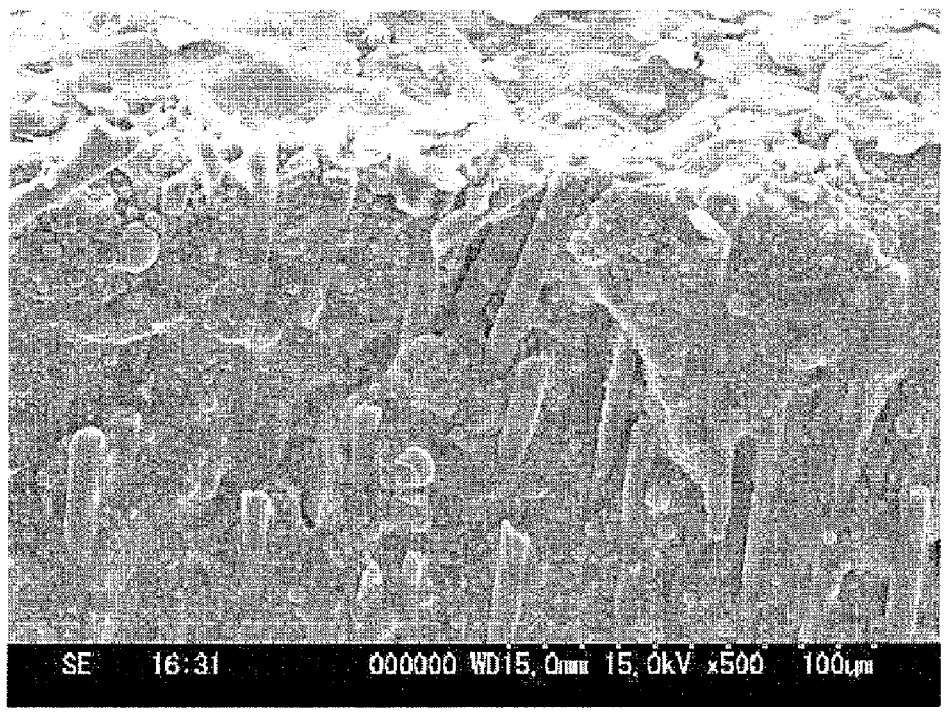
FIG. 7 is an electron micrograph showing a cross-section of the body after the forming step of Example 1.

Successively, as a forming step, the outer surface 16 of the body 11 was polished using abrasive paper with abrasive particles whose particle size was 10 μm to form the protrusions 14b in the ends of the carbon fiber exposed from the outer surface 16 and thus a sheet-like body 11 was obtained. When the outer surface 16 of the body 11 after the forming step was observed with an electron microscope, formation of the protrusions 14b was found as shown in FIG. 6A or more FIG. 7. Furthermore, it was observed that the proportion of the exposed carbon fibers on the outer surface 16 was increased as compared with the outer surface 16 of the body 11 after the exposing step and before the forming step.

Next in Example 2, the body 11 was obtained in the same manner as in Example 1 except that the conditions of each step were changed as follows. In the preparation step, the average fiber length of the carbon fiber of Example 1 was changed to 100 μm. In the orienting step, only a magnetic field was applied to the composition. In the molding step, the composition was heated at 120° C. for 90 minutes to cure the liquid silicone gel and a sheet-like body 11 was obtained. In the exposing step, carbon fibers were exposed by removing cured silicone to a thickness of 5 μm by polishing with a metal mesh from the outer surface 16 of the body 11. The thickness of the body 11 after the exposing step was 0.2 mm. When the outer surface 16 of the body 11 after the exposing step was observed with an electron microscope, exposure of the carbon fibers was found and the proportion of the carbon fibers exposed on and intersecting the outer surface 16 in the exposed carbon fibers was about 50%. When the outer surface 16 of the body 11 after the forming step was observed with an electron microscope, formation of the protrusions 14b was found. Furthermore, it was observed that the proportion of the exposed carbon fibers on the outer surface 16 was increased as compared with the outer surface 16 of the body 11 after the exposing step and before the forming step.

In Example 3, the body 11 was obtained in the same manner as in Example 1 except that the conditions of each step were changed as follows. In the preparation step, carbon fiber (PBO carbon fiber) formed using polyparaphenylene benzobisoxazole fiber as a precursor was used as the fibrous filler 14 and the amounts of the constituents were changed as shown in Table 1. The average fiber length of the PBO carbon fiber was 6000 μm. In the molding step, the composition was heated at 120° C. for 90 minutes to cure the liquid silicone gel and a sheet-like body 11 was obtained. In the exposing step, PBO carbon fiber were exposed by removing cured silicone with a rotary cutter from the outer surface 16 of the body 11. The thickness of the body 11 after the exposing step was 0.2 mm.

Figure 6B:
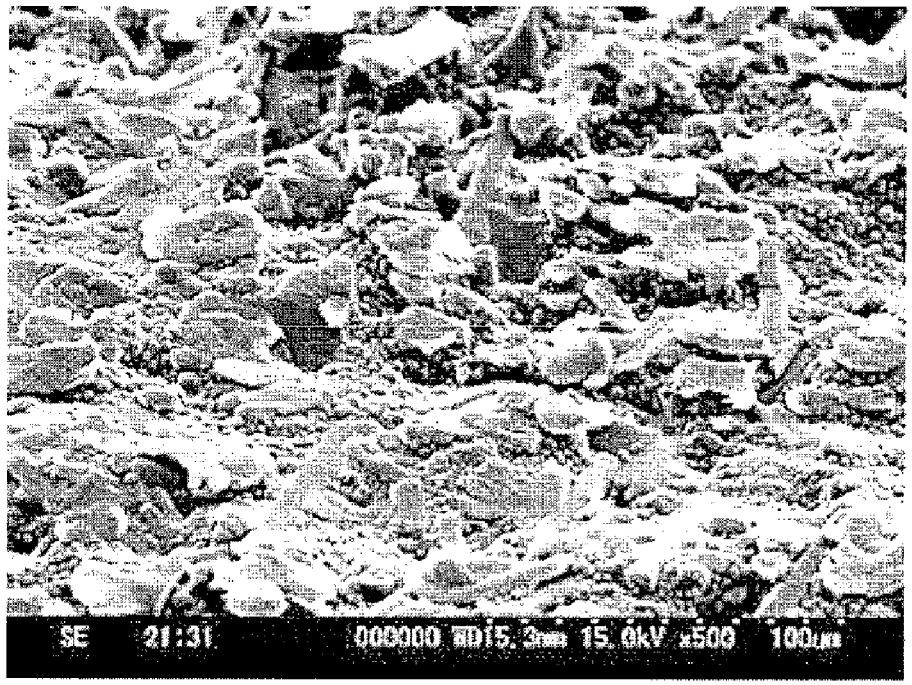
FIG. 6B is an electron micrograph showing the outer surface of the body from obliquely above after the forming step of Example 1.
Figure 8:
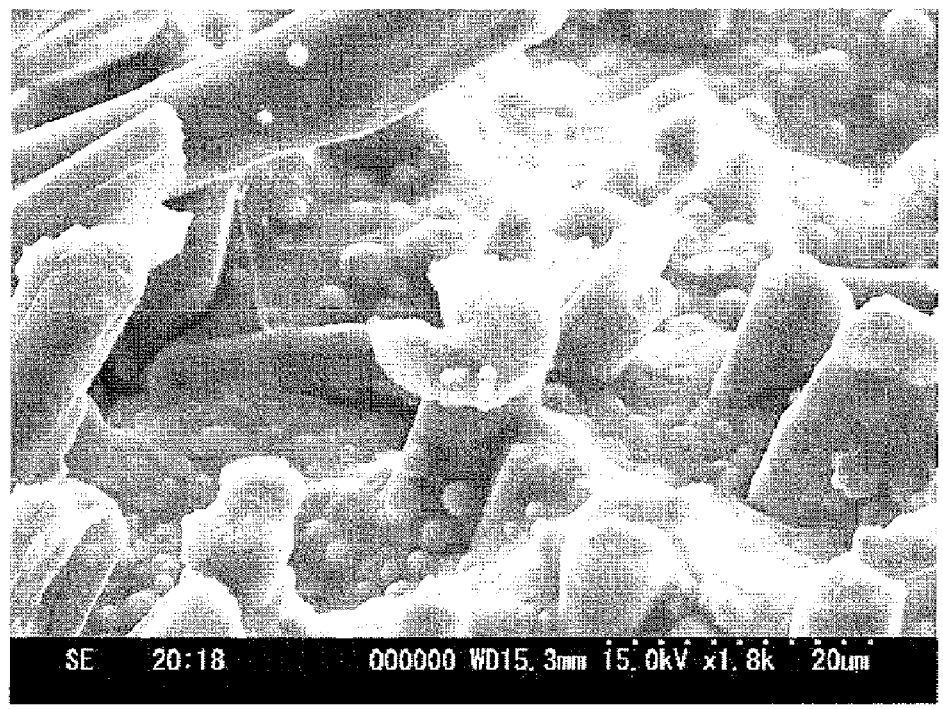
FIG. 8 is an electron micrograph showing the outer surface of the body from obliquely above after the forming step of Example 3.
Figure 9:
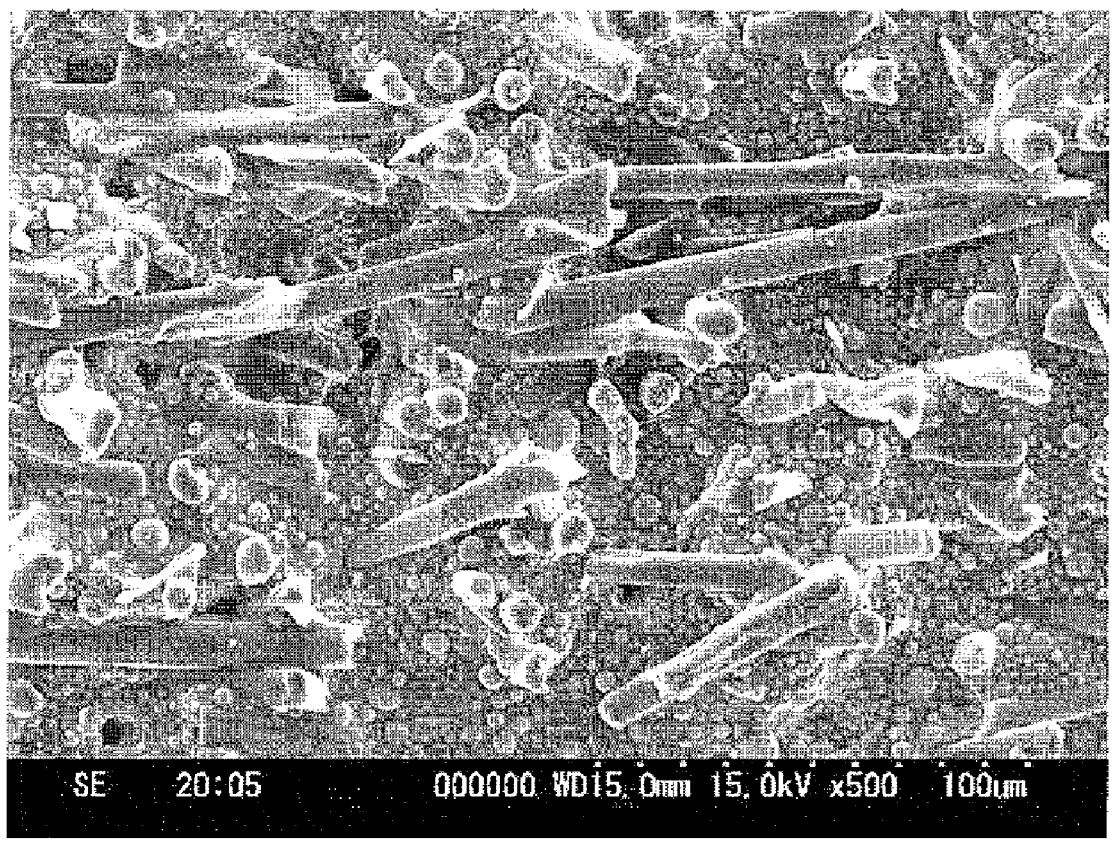
FIG. 9 is an electron micrograph showing the outer surface of the body from above after the forming step of Example 3.

When the outer surface 16 of the body 11 after the exposing step was observed with an electron microscope, exposure of the PBO carbon fibers was observed and the proportion of the PBO carbon fibers exposed on and intersecting the outer surface 16 in the exposed PBO carbon fibers was about 70%. In the forming step, pressure was applied to the outer surface 16 of the body 11 uniformly for a moment to form the protrusions 14b in the ends of the PBO carbon fibers exposed from the outer surface 16 and the sheet-like body 11 was obtained. When the outer surface 16 of the body 11 after the forming step was observed with an electron microscope, formation of the protrusions 14b was observed as shown in FIG. 8 and FIG. 9. Furthermore, it was observed that the proportion of the exposed carbon fibers on the outer surface 16 was increased as compared with the outer surface 16 of the body 11 after the exposing step and before the forming step. In addition, the protrusions 14b of Example 3 were protruded from the outer surface 16 as compared with the protrusions 14b of Example 1 as shown in FIG. 6B and FIG. 8.

In Example 4, the preparation step and orienting step were performed in the same manner as in Example 1 except that the average fiber length of the carbon fiber was changed to 100 μm and the amounts of the constituents were changed as shown in Table 1. Subsequently molding step was performed in the same manner as in Example 2 and a sheet-like body 11 was obtained. In the exposing step, carbon fibers are exposed by polishing using abrasive paper with abrasive particles whose particle size was 50 μm to remove cured silicone from the outer surface 16 of the body 11. And the forming step was performed in the same manner as in Example 1 and the body 11 was obtained. The thickness of the body 11 after the exposing step was 0.2 mm. When the outer surface 16 of the body 11 after the exposing step was observed with an electron microscope, exposure of the carbon fibers was found and the proportion of the carbon fibers exposed on and intersecting the outer surface 16 in the exposed carbon fibers was about 70%. When the outer surface 16 of the body 11 after the forming step was observed with an electron microscope, formation of the protrusions 14b was found. Furthermore, it was observed that the proportion of the exposed carbon fibers on the outer surface 16 was increased as compared with the outer surface 16 of the body 11 after the exposing step and before the forming step.

In Example 5, the body 11 was obtained in the same manner as in Example 1 except that the conditions of the preparation step were changed as follows. In the preparation step, PBO carbon fiber was used as the fibrous filler 14 and the amounts of the constituents were changed as shown in Table 1. When the outer surface 16 of the body 11 after the exposing step was observed with an electron microscope, exposure of the PBO carbon fibers was found and the proportion of the PBO carbon fibers exposed on and intersecting the outer surface 16 in the exposed PBO carbon fibers was about 100%. When the outer surface 16 of the body 11 after the forming step was observed with an electron microscope, formation of the protrusions 14b was observed. Furthermore, it was observed that the proportion of the exposed PBO carbon fibers on the outer surface 16 was increased as compared with the outer surface 16 of the body 11 after the exposing step and before the forming step.

In Comparative Example 1, the body 11 was obtained in the same manner as in Example 5 except that the exposing step and forming step were omitted. In Comparative Example 2, the body 11 was obtained in the same manner as in Example 2 except that the exposing step and forming step were omitted. In Comparative Examples 1 and 2, when the outer surface 16 of the body 11 after the forming step was observed with an electron microscope, the fibrous filler 14 was not exposed on the outer surface 16. Each body 11 of the Examples and Comparative Examples was subjected to measurement and analysis on each of the following items. The results are shown in Table 1. In Table 1, the "proportion (%) of the fibrous filler" column shows a proportion of each fiber exposed on and intersecting the outer surface 16.

<Handling Properties>

Handling properties of each body 11 of each example and Comparative Examples were evaluated based on the adhesiveness thereof. In the handling properties in Table 1, numeral "1" designates that the adhesiveness of the body 11 is moderately low and handling of the body 11 was easy. Numeral "2" designates that the adhesiveness of the body 11 is excessively high and handling of the body 11 was difficult.

<Thermal Conductivity>

After test pieces in the form of a disc (diameter: 1.0 mm, thickness: 0.5 mm) were obtained from the body 11 of each Example and Comparative Examples, thermal conductivity of the test pieces was measured by laser flash method.

<Thermal resistance Value>

After test pieces (length and width: 10 mm, thickness: 0.2 mm) were obtained from the body 11 of each Example and Comparative Examples, each test piece was sandwiched with the heat generating body 18 whose calorific value was 25 W and the heat radiating body 19. Thermal resistance value of each test piece was measured while a load of 50 N/cm$^2$ was applied in the thickness direction. The measurement of the thermal resistance value was performed on each body 11 after exposing step and after forming step. The results of measurement in which thermal resistance value was measured in the same manner as above except commercial thermally conductive grease was used in substitution for test pieces are shown in Table 2. In Table 2, "Referential Example 1" column shows results of measurement when thermally conductive grease (an oil compound for radiation of heat) G-750 manufactured by Shin-Etsu Chemical Co., Ltd. as thermally conductive grease was used, and "Referential Example 2" column shows results of measurement when thermally conductive grease (an oil compound for radiation of heat) G-751 manufactured by Shin-Etsu Chemical Co., Ltd. as thermally conductive grease was used.

TABLE 1

|  |  | Ex. 1 | Ex. 2 | Ex. 3 | Ex. 4 | Ex. 5 | C. Ex. 1 | C. Ex. 2 |
| --- | --- | --- | --- | --- | --- | --- | --- | --- |
|  | Liquid Silicone (mixture amount) | 100 | 100 | 100 | 100 | 100 | 100 | 100 |
| Carbon Fiber | Mixture Amount | 120 | 120 | 120 | 100 | 120 | 120 | 120 |
|  | Average Fiber Length (μm) | 160 | 100 | 6000 | 100 | 160 | 160 | 100 |
|  | Alumina (mixture amount) | 475 | 475 | 500 | 800 | 475 | 475 | 475 |
|  | Viscosity (25° C., 1.0 rpm) mPa · s | 600,000 | 165,000 | 1,100,000 | 1,200,000 | 600,000 | 600,000 | 165,000 |
|  | Magnetic Field | Applied | Applied | Applied | Applied | Applied | Applied | Applied |
| Vibration | Frequency | 3.0 Hz | Not Applied | 3.0 Hz | 3.0 Hz | 3.0 Hz | 3.0 Hz | Not Applied |
|  | Amplitude | 10 mm | | 10 mm | 10 mm | 20 mm | 20 mm | |
|  | Exposing Step | Applied | Applied | Applied | Applied | Applied | Not Applied | Not Applied |
|  | Forming step | Applied | Applied | Applied | Applied | Applied | Not Applied | Not Applied |
|  | Proportion (%) of Fibrous Filler | 90 | 50 | 70 | 70 | 100 | | |

TABLE 1-continued

|  | Ex. 1 | Ex. 2 | Ex. 3 | Ex. 4 | Ex. 5 | C. Ex. 1 | C. Ex. 2 |
|---|---|---|---|---|---|---|---|
| Handling Properties | 1 | 1 | 1 | 1 | 1 | 2 | 2 |
| Thermal Conductivity (W/m·K) | 40 | 35 | 50 | 25 | 50 | 30 | 25 |
| Thermal Resistance Value (° C./W) after Exposing Step | 0.24 | 0.25 | 0.23 | 0.30 | 0.19 | 0.32 | 0.36 |
| Thermal Resistance Value (° C./W) after Forming Step | 0.18 | 0.22 | 0.19 | 0.27 | 0.13 |  |  |

TABLE 2

|  | Referential Example 1 | Referential Example 2 |
|---|---|---|
| Thermal Resistance Value (° C./W) | 0.15 | 0.14 |

As shown in Table 1, Examples 1 to 5 showed excellent evaluation and results for each item. Therefore the body 11 of each Example was excellent in thermal conduction performance and was able to enhance the handling properties. Furthermore, after the body 11 on which the thermal resistance value was measured, was removed from the heat generating body 18 and the heat radiating body 19, the outer surface 16 of the body 11 was observed, and each exposed fiber was immersed into the body 11. Furthermore, the protrusions 14b of each fiber were located almost on the outer surface 16 of the body 11.

In addition, in Examples 1 to 5, the thermal resistance value of the body 11 after the forming step was lower as compared with the thermal resistance value of the body 11 after the exposing step. These results are thought to have been caused by the protrusions 14b provided through the forming step. The body 11 of Example 5 had a thermal resistance value equivalent to that of thermally conductive grease. The thermally conductive grease generally has a very low thermal resistance value and shows excellent thermal conduction performance. However, thermally conductive grease has problems in recycling, management, and handling such as changes in the viscosity, as well as problems in reliability such as aeration, extrusion, and volatilization at the time of use. In contrast, the body 11 of the present invention enables to obtain a thermal resistance value equivalent to that of thermally conductive grease without resulting in the above-mentioned problems of the thermally conductive grease.

On the other hand, the evaluation on handling properties and the results on the thermal resistance value in Comparative Example 1 and 2 were inferior to those in each Example. Therefore the body 11 of each Comparative Example was inferior in both thermal conduction performance and handling properties as compared with each Example.

The invention claimed is:

1. A thermally conductive body for placement between a heat generating body and a heat radiating body, the thermally conductive body being molded formed from a thermally conductive polymer composition; the thermally conductive polymer composition comprising:
    a polymer matrix; and
    a thermally conductive filler, in which at least part of the thermally conductive filler is formed in the shape of fibers, and oriented in a certain direction,
    wherein an outer surface of the thermally conductive body intersects said direction and contacts at least one of the heat generating body and the heat radiating body at the time of use,
    wherein the thermally conductive filler formed in the shape of fibers includes:
        ends that are exposed on the outer surface and have protrusions extending along the outer surface, said protrusions having a cross-section perpendicular to a fiber axial direction which is larger than the cross-section of the fiber that is within the polymer matrix.

2. The thermally conductive body according to claim 1 wherein the thermally conductive filler formed in the shape of fibers comprises carbon fibers.

3. The thermally conductive body according to claim 1, wherein the thermally conductive filler formed in the shape of fibers includes:
    a rod-like portion;
    a fiber axial direction; and
    a cross section perpendicular to the fiber axial direction in the rod-like portion, and
    wherein the end having a protrusion of the thermally conductive filler formed in the shape of fibers includes:
        a cross section which is perpendicular to the fiber axial direction of the thermally conductive filler formed in the shape of fibers and larger than a cross section which is perpendicular to the fiber axial direction of the thermally conductive filler formed in the shape of fibers at the rod-like portion.

4. The thermally conductive body according to claim 1, wherein the polymer matrix is a polymer material of a silicone type or an acrylic type.

5. The thermally conductive body according to claim 1, wherein the polymer matrix has a viscosity of 1000 mPa·s or less at 25° C.

6. The thermally conductive body according to claim 1, wherein the content of the thermally conductive filler in the above thermally conductive polymer composition is 90 mass% or less.

7. The thermally conductive body according to claim 1, wherein the proportion of the thermally conductive filler formed in the shape of fibers in the total amount of the thermally conductive filler is 7 mass% or more and less than 35 mass%.

8. The thermally conductive body according to claim 1, wherein the proportion of the thermally conductive filler formed in the shape of fibers exposed on and intersecting the outer surface is 50 to 100%.

9. The thermally conductive body according to claim 1, wherein the thermally conductive filler formed in the shape of fibers has a distal end, and the distance between the outer surface and the distal end of the fibrous filler which is exposed on and intersecting the outer surface of the body is not more than 50 μm.

10. A method for manufacturing a thermally conductive body which is for placement between a heat generating body and a heat radiating body, the thermally conductive body being molded formed from a thermally conductive polymer composition; the thermally conductive polymer composition including:
  a polymer matrix; and
  a thermally conductive filler, in which at least part of the thermally conductive filler is formed in the shape of fibers, and oriented in a certain direction,
  wherein an outer surface of the thermally conductive body intersects said direction and contacts at least one of the heat generating body and the heat radiating body at the time of use,
  wherein the thermally conductive filler formed in the shape of fibers includes:
  ends that are exposed on the outer surface and have protrusions extending along the outer surface,
  the method comprising:
  preparing the thermally conductive polymer composition;
  orienting the thermally conductive filler formed in the shape of fibers in a certain direction;
  molding the thermally conductive body from the thermally conductive polymer composition while maintaining the orientation of the above thermally conductive filler,
  exposing ends of the oriented thermally conductive filler on the outer surface; and
  forming a protrusion in the end of the thermally conductive filler.

11. The method according to claim 10, wherein the step of orienting is performed by applying a magnetic field to the thermally conductive polymer composition, thereby orienting the thermally conductive filler formed in the shape of fibers.

12. The method according to claim 11, wherein the step of orienting is performed by further applying vibration to the above thermally conductive polymer composition, thereby orienting the thermally conductive filler formed in the shape of fibers.

13. The method according to claim 12, wherein the thermally conductive polymer composition has a natural frequency, and the vibration applied to the thermally conductive polymer composition has a frequency lower than the natural frequency of the thermally conductive polymer composition.

14. The method according to claim 13, wherein the frequency of the vibration applied to the thermally conductive polymer composition is 0.1 to 100 Hz.

15. The method according to claim 14, wherein the frequency of the vibration applied to the thermally conductive polymer composition is 1 to 100 Hz.

16. The method according to claim 12, wherein the vibration applied to the thermally conductive polymer composition has an amplitude of 0.1 to 20 mm.

17. The method according to claim 16, wherein the vibration applied to the thermally conductive polymer composition has an amplitude of 1 to 20 mm.

* * * * *